(12) United States Patent
Barker (10) Patent No.: US 7,932,769 B2
(45) Date of Patent: *Apr. 26, 2011

(54) PROTECTED POWER DEVICES

(75) Inventor: Richard J. Barker, Stockport (GB)

(73) Assignee: NXP B.V., Eindhoven (NL)

( * ) Notice: Subject to any disclaimer, the term of this patent is extended or adjusted under 35 U.S.C. 154(b) by 40 days.

This patent is subject to a terminal disclaimer.

(21) Appl. No.: 12/315,649

(22) Filed: Dec. 5, 2008

(65) Prior Publication Data

US 2009/0179687 A1 Jul. 16, 2009

Related U.S. Application Data

(63) Continuation of application No. 10/552,947, filed as application No. PCT/IB2004/001156 on Apr. 8, 2004, now Pat. No. 7,477,089.

(30) Foreign Application Priority Data

Apr. 16, 2003 (GB) .................................... 0308758.2

(51) Int. Cl.
*H03K 17/687* (2006.01)

(52) U.S. Cl. ......................................... 327/434; 327/427
(58) Field of Classification Search .................... 327/95, 327/427, 434

See application file for complete search history.

(56) References Cited

U.S. PATENT DOCUMENTS

| 6,600,692 B2 * | 7/2003 | Tanzawa | 365/226 |
| 6,707,697 B2 * | 3/2004 | Dray et al. | 365/104 |
| 7,477,089 B2 * | 1/2009 | Barker | 327/427 |
| 2006/0050584 A1 * | 3/2006 | Gogl et al. | 365/207 |

* cited by examiner

*Primary Examiner* — Long Nguyen (57) ABSTRACT

A power insulated gate field effect transistor has main cells (2) controlled by a main cell insulated gate and sense cells (4) controlled by a sense cell insulated gate. A sample and hold circuit (10, 50) is arranged to operate in a plurality of states including at least one sample state and a hold state to sense the current flowing through the sense cells (4) when in the at least one sample state but not in the hold state. The sample states may be used in a feedback loop to control a drive amplifier (20) driving the gates of the main and sense cells (2,4) and/or to mirror the current in the sense cells (4) on a measurement output terminal (58).

14 Claims, 5 Drawing Sheets

PROTECTED POWER DEVICES

RELATED PATENT DOCUMENTS

This patent document is a continuation under 35 U.S.C. §120 of U.S. patent application Ser. No. 10/552,947 filed on Oct. 13, 2005 now U.S. Pat. No. 7,477,089, which is a 35 U.S.C. §371 national stage entry of International Application No. PCT/IB2004/001156 filed on Apr. 8, 2004, which claims priority benefit under 35 U.S.C. §119 of European Patent Application No. 0308758.2 filed on Apr. 16, 2003, to which priority is also claimed here.

The invention relates to protected power devices, and in particular to protected power devices with a current measurement or current limiting circuit.

There is an increasing demand for integrated devices including current measurement facilities with a silicon switch. This is particularly apparent in the automotive sector. Such switches can be dedicated high-side switches or dedicated low side switches.

More recently, devices have been coming on to the market which can function either as a high-side or a low side device. These devices need to be compatible with either high side or low side devices. In general, low side devices impose more stringent requirements, since a low side n-type field effect power transistor will generally have its drain in the substrate and its source will be connected to the most negative potential available.

In these circuits, it is not possible to use conventional virtual earth type current sensing amplifiers since these rely on being able to control the potential of a summing junction by sourcing current from a more negative node. In low side circuits, a negative supply capable of supplying currents of order several milliamps is generally not available.

Thus, an alternative current measurement circuit would be desirable. Such circuits may be used in current trip circuits, in which the transistor is switched off if the current exceeds a predetermined value, or in current limiting circuits in which the current value is used in a control loop to limit the current through the transistor.

In current limiting circuits, there is a difficult trade off between maintaining stability and freedom from oscillation whilst dealing adequately in the same circuit with abnormal load conditions, in particular to maintain a rapid response. This exacerbates the problem of integration with low side devices using conventional virtual earth type amplifiers.

There is thus a need for improved power devices including current limiting and/or measurement circuits.

According to the invention there is provided a power insulated gate field effect transistor, having main cells controlled by a main cell insulated gate and sense cells controlled by a sense cell insulated gate; and a sample and hold circuit connected in series with the sense cells and arranged to operate in a plurality of states including at least one sample state and a hold state; wherein the sample and hold circuit is arranged to sense the current flowing through the sense cells when in the at least one sample state but not in the hold state.

The circuit uses a sense cell type architecture in which the current passing through the sense cells is only measured in the sample state and so only needs a current sink in the sample state. Although it is not generally practicable to provide a continuous supply capable of sinking this current, it is practicable to provide a sink capable of sinking the current for some of the time, for example 5% to 20% of the time, as required in the present invention.

Preferably, the sample and hold circuit is a feedback sample and hold circuit connected to the sense cells and arranged to operate in a feedback sample state to sense the current passing through the sense cells and having an output arranged to drive the sense cell gate towards a voltage in which a target current passes through the sense cells, and to operate in the hold state to hold its output voltage and to drive the main cell insulated gate with that output voltage.

In a particularly preferred arrangement the output from the feedback sample and hold circuit is on a gate drive node connected to the main cell gate electrode through a first switch, the first switch being held open in the sample state to isolate the main cell insulated gate from the gate drive node and closed in the hold state to drive the main cell insulated gate from the gate drive node.

By isolating the control loop from the main cells in this way, the main cells shield to a large extent the control loop from the effects of the load. The control loop through the feedback sample and hold circuit is a small signal loop that can rapidly attain the required conditions. This greatly increases the stability.

The device may include control circuitry connected to control the switch or switches for cycling between the sample and the hold states with a duty cycle in which the ratio of time in the sample state or states to time in the hold state is in the range 1:5 to 1:50.

The sample and hold circuit may contain a mirror summing node connected to the source of the sense cells; a current sink field effect transistor (FET) connected to the summing node to sink the current passing through the sense cells in the sample mode; a summing node sample and hold amplifier with an amplifier input connected to the mirror summing node and an amplifier output connected to the gate of the current sink FET through a third switch, the third switch being closed in the or each sample state to control the current sink so that the summing node is a virtual earth; and at least one mirror FET mirroring the current sink FET, the output of the summing node amplifier connecting to the gate of the mirror FET to control the mirror FET to mirror in the mirror FET the current passing in the current sink FET in a sample state.

The device may also include a measurement output terminal for supplying a signal indicative of the current passing through the sense cells.

In some embodiments, a plurality of mirror FETs may be connected, the sample and hold circuit being arranged with a corresponding plurality of sample states to mirror the current passing through the current sink FET in the corresponding sample state.

The at least one mirror FET may include a current mirror FET connected to a feedback sample and hold amplifier connected to drive the gate of the sense cells and connected through a first switch to drive the gate of the main cells in the hold mode. There may be further provided a current source sourcing current into a voltage drive node connected to an input of the feedback sample and hold amplifier, the voltage drive node connected through the current mirror FET to a current sink. Such arrangements provide a current limited arrangement as explained in more detail above. However, note that the provision of a feedback control loop is not required in every case, for example if the power semiconductor transistor is connected in a current trip arrangement rather than a current limit arrangement.

Thus as well as or instead of a current mirror FET in a feedback loop driving the gates of the main and sense cells, the at least one mirror FET may include a measurement mirror FET connected to a measurement output terminal, and the at least one sample state includes a measurement sample state in which the current on the sense cells is mirrored on the measurement output terminal. Such arrangements may be used in current-limited or current trip circuits.

The measurement mirror FET may be connected to a measurement output terminal. The circuit may operate in a measurement sample state with the fifth switch closed and the second switch open to mirror the current passing through the current sink FET on the measurement mirror FET.

The current supply may be pulsed to operate only in the sample state or states.

The circuit may include a charge pumped current sink connected to the mirror FET or FETs to sink the current passing through the or each mirror FET. A suitable sink is much easier to arrange in the sample and hold circuit of the present invention than in prior arrangements, since the current sink only needs to sink current in the or each sample state, not continuously. Charge pump techniques may accordingly be used for the current sink. Indeed, a common current sink may be used to sink the currents passing through the or each mirror FET and the current sink FET.

The device may further include a second switch connected between the input summing node and one of the source or drain of the main cells of the power insulated gate field effect transistor, the second switch being open in the sample state and closed in the hold state to provide a current path for current passing through the sense cells in the hold mode that does not pass through the current mirror.

The device may further include a fourth switch connected to the gate of the current sink FET to switch off the current sink FET in the hold mode.

In a particularly preferred arrangement, the current supply is pulsed to operate only in the sample state or states; the third switch is provided between the summing node amplifier and a common node; and the gates of the or each mirror FET and the current sink FET are connected to the common node.

This allows the provision of auto-zero circuitry for zeroing the summing node amplifier during the hold state in which the second switch is open. A particular problem in prior art arrangements is that small zero offsets on amplifiers make it very difficult to achieve sufficient accuracy in current measurement. In the circuit of the preferred arrangement, the second switch can be opened during some or all of the hold state to allow for autozeroing of the summing node amplifier.

This circuit also allows measurement, if a measurement mirror FET is provided with a gate connected to the common node. The circuit may operate in a measurement sample state in which the second switch is closed and current passing through the sense cells is mirrored on the measurement mirror FET.

In another aspect, the invention relates to a device, comprising: a power insulated gate field effect transistor, having main cells controlled by a main cell insulated gate and sense cells controlled by a sense cell insulated gate; a mirror summing node connected to the source of the sense cells; a current sink field effect transistor (FET) connected to the mirror summing node to sink the current passing through the sense cells in a sample state; a sample and hold summing node amplifier operable in at least one sample state and a hold state, the sample and hold summing node amplifier having an amplifier input connected to the mirror summing node and an amplifier output connected to the gate of the current sink FET; and at least one mirror FET mirroring the current sink FET, the output of the summing node amplifier connecting to the gate of the mirror FET to control the mirror FET to mirror the current passing in the current sink FET in a sample state.

In a yet further aspect, the invention relates to a device, comprising: a power insulated gate field effect transistor, having main cells controlled by a main cell insulated gate and sense cells controlled by a sense cell insulated gate; a feedback sample and hold circuit connected to the sense cells and arranged to operate in a sample state to sense the current passing through the sense cells and having an output arranged to drive the sense cell gate towards a voltage in which a target current passes through the sense cells, and to operate in a hold state to hold its output voltage and to drive the main cell insulated gate with that output voltage.

In another aspect, the invention relates to a method of operating a field effect transistor, including:

providing a power field effect transistor having main cells controlled by main cell insulated gates and sense cells controlled by sense cell insulated gates, and a sample and hold circuit connected to the sense cells;

switching to at least one sample state in which the sample and hold circuit outputs a voltage to drive the sense cells but not the main cells, and sensing the sense cell current;

switching to a hold state in which the sense cell current is not measured; and cycling between the sample and hold states.

The ratio of the time in the sample state to time in the hold state may preferably be in the range 1:5 to 1:20.

Figure 1:
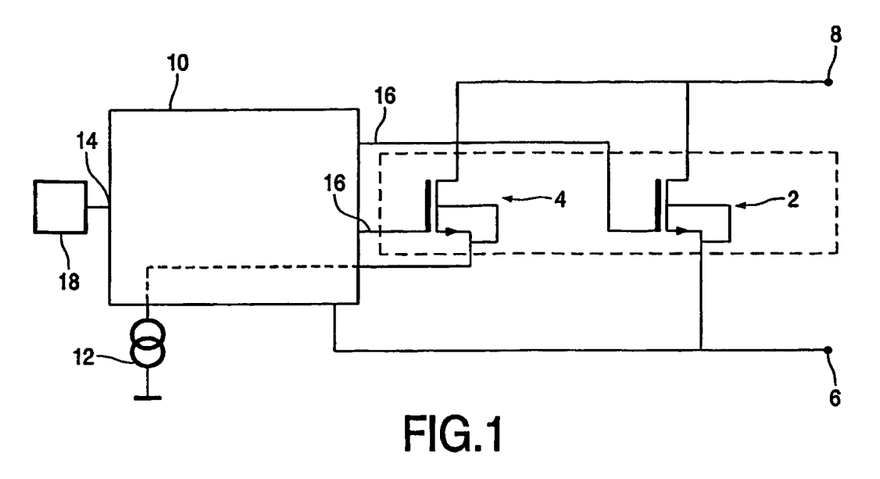
FIG. 1 shows a circuit diagram of a first embodiment of the invention.

Embodiments of the invention will now be described, purely by way of example, with reference to the accompanying drawings in which:

FIG. 1 shows a functional schematic diagram of a first embodiment of the invention.

A power MOSFET (metal oxide semiconductor field effect transistor) is divided into separate main cells 2 and sense cells 4, each connected to a common drain output terminal 8 and the main cells 2 being connected to a common source output terminal 6.

The sense cells 4 are connected through a feedback sample and hold circuit 10 to a current sink 12, in the specific embodiment a charge pumped current sink.

The feedback sample and hold circuit 10 has a clock input 14 for accepting a clock signal from driver 18 and has outputs 16 connected to drive the gates of the main and sense cells 2, 4.

The system is configured to operate in two states, a feedback sample state and a hold state, as will be described below, and is switched between them cyclically. The sample and hold circuit 10 operates in the sample state as a feedback circuit targeting a particular current, and in the hold state it holds its output voltage at the level it was when it was put into hold mode.

Normal operation can be understood by considering one complete cycle of operation, and assuming a previously established current in the main cells 2.

In the feedback sample state, the sample and hold circuit 10 controls only the sense cell 4 gates, and the main cell 2 gates stay at an approximately constant potential maintained by the main cell gate capacitance. In this configuration, the sample and hold circuit acts as a control loop which targets the current through the sense cells 4 to be a predetermined target current which is corresponds to the design current that the sense cells should carry.

At the end of the feedback sample state of the cycle a voltage will be established on the gate of the sense cells that represents, to a precision limited by circuit slew and settling times, the voltage that is required to establish the target current in the sense cells.

In the hold state, this voltage is applied to the gate of the main cells 2 and results in a corresponding current passing through the main cells. The value of the target current is chosen so that the corresponding current in the main cells is approximately equal to the required current limit in the device.

The voltage on the gates of the main cells does not have to reach the final value during a single hold state. The voltage just has to move significantly in the right direction and successive hold pulses will allow the voltage to home in on the correct value. Thus, the length of the hold state can be shorter than the settling time of the main cell gates.

When the circuit switches back to the feedback sample state the circuit should quickly stabilise and acquire the new current control conditions. It can be seen that to a first approximation the sampling precision will accumulate successive sampling pulses to compensate for a short acquisition time.

The fact that the main cell 2 gates are not connected in the feedback sample state ensures that the feedback loop is a small-signal feedback loop that can accordingly quickly stabilise. The main cell 2 gates have sufficient capacitance that their voltage remains substantially constant, thus shielding the feedback loop from variation, for example variation in the load.

There may be limits to the current that can flow through the cells 2,4 determined by the circuitry connected to output terminals 6,8. In this case, the sample and hold circuitry will simply ensure that the cells 2,4 are fully on; the target current will not be reached. In this configuration the total current will be less than the current limit so this is entirely satisfactory.

Figure 2:
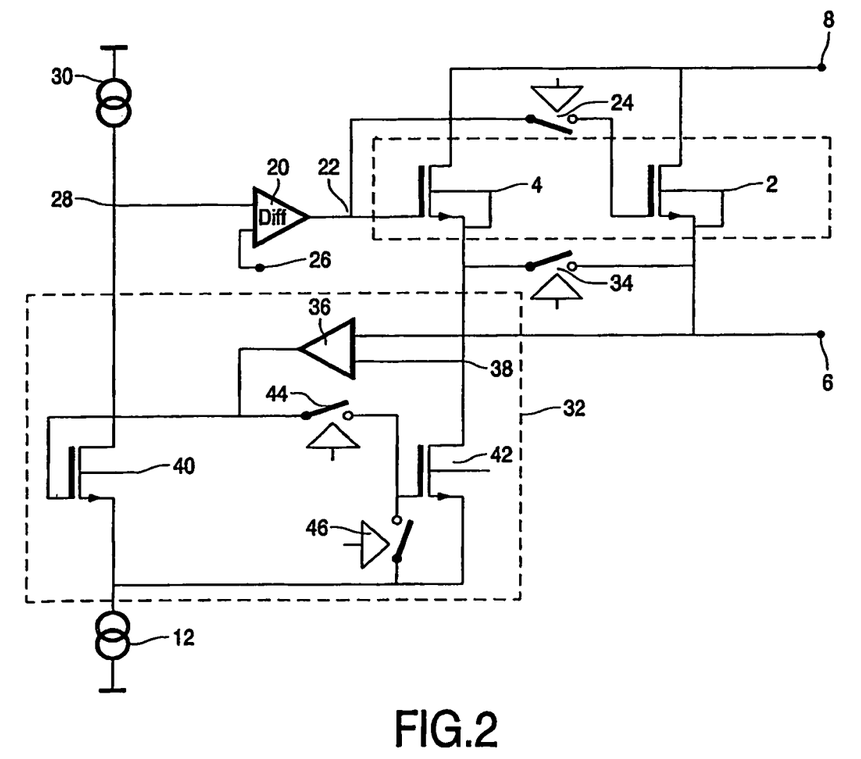
FIG. 2 shows a circuit diagram of a second embodiment of the invention.

FIG. 2 shows a second embodiment of the invention in more detail.

The sample and hold circuit includes a first differential sample and hold voltage amplifier 20, which will be referred to for convenience as first amplifier 20, connected to drive a gate drive node 22 which is connected directly to the gate of the sense cells 4 and through a first switch 24 to the gate of the main cells 2. The negative input of the first amplifier 20 is connected to a reference voltage supply 26 and the positive input to an input summing node 28. A reference current source 30 sources current into the input summing node 28 and a current mirror circuit 32 is connected between the source of the sense cells 4, the input summing node 28 and a current sink 12. A second switch 34 connects the source of the sense cells 4 to the source of the main cells 2 and hence to the source terminal 6.

The current mirror circuit 32 includes a second differential sample and hold voltage amplifier 36, referred to for convenience as second amplifier 36, with its negative input connected to the source terminal 6 and its positive input to a mirror summing node 38 connected to the source of the sense cells 4. A mirror sink FET 40 connects the input summing node 28 to the current sink 12 and a current sink FET 42 connects the mirror summing node 38 to the current sink 12. The output of the second amplifier 36 is connected to drive the gate of the mirror FET 40 and through a third switch 44 to the gate of the current sink FET 42. A fourth switch 46 connects the gate of the mirror summing node to the source of the current sink FET 42.

The switches are in this embodiment CMOS type logic controlled switches with appropriately selected specifications, in particular suitable on-resistances.

The amplifiers 20,36 operate in the feedback sample state as operational amplifiers, but in the hold state they utilise their own gain to effect a hold function to maintain their own output voltage at the level it was when the amplifier was put into hold mode.

Normal operation can be understood by considering one complete cycle of operation, and assuming a previously established current in the main cells 2. The system has two basic operating states, namely hold and feedback sample states, that it will switch between at a cycle rate of several 100's of kHz with a duty cycle of 7/1 or 15/1.

In the hold state the first, second and fourth switches are closed and the third switch open. The first amplifier 20 holds its output at a constant potential with respect to the main source terminal 6, the constant potential being determined by the previous sample state. The second amplifier 36 has its output held at a constant potential with respect to the charge pumped negative rail provided by the negative charge pump, i.e. current sink 12, the voltage being defined by the previous "sample" state.

In the feedback sample state, the first, second and fourth switches are open and the third switch closed. The first amplifier 20 operates to provide the gain for a current regulating loop trying to control the current in the sense cells to a level defined by the current from reference current source 30.

In this mode the second amplifier 36 provides the gain to establish the mirror summing node 38 as a virtual earth summing junction and the current in the current sink FET 42 will be equal to the current coming out of the sense cells 4. Because the third switch 44 is closed and the fourth switch 46 open the circuit will try to "mirror" the current flowing in mirror sink FET 40 as a scaled "copy" of the current flowing in the current sink FET 42.

Input summing node 28 also acts as a virtual earth that compares the current flowing in the mirror FET 40 with the reference current Iref from the current source 30 and the potential on the input summing node 28 will rise and fall in an attempt to achieve balance. This varying potential multiplied by the open loop gain of the first differential amplifier 20 in the sample mode alters the gate-source voltage on the sense cells 4 and hence the current in them to attempt to achieve a target current in the sense cells 4 that corresponds to that of Iref, with a scaling factor determined by the circuit configuration.

It is interesting, and important, that the main cells 2 do not feature directly in this control loop. The sense cells 4 are thus operating in a small signal current control loop operating with their drain terminals driven from a voltage source and so have no reactive load. The absence of such a reactive load minimises a 2nd order gain-phase characteristic that might otherwise occur as a result of the combined effect of an inductive load and the Miller capacitance. In other words the main cells 2 are shielding the sense cells 4 from the phase variations generated by the load as a reaction to the control loop.

At the end of the sample state of the cycle a voltage will be established on the gate of the sense cells 4 and held in the hold mode. First the amplifiers 20, 36 are switched into hold mode in which their output is held.

First switch 24 is closed to apply the first amplifier output voltage to the gate of the main cells 2 and this results in a current substantially equal to the required current limit flowing through the FET whilst the drain conditions remain substantially unchanged. Second switch 34 is closed to short the inputs of the second amplifier together.

When the circuit is switched into the hold mode the voltage levels within the control loops are locked and the virtual earth is de-activated. The current through the current sink FET 42, which has to be supplied by the charge pump in current sink 12, is reduced to zero leaving the current sink 12 supplying essentially only the current through mirror FET 40. The sense cell current is routed through the second switch 34. The main cell 2 gate is connected in parallel with the gate of the sense cells 4 both of them being fed from the "locked" output of first amplifier 20. During this period the load on the current sink 12 is minimised which will allow its reservoir capacitor to slowly charge back up to support another sample pulse with a duty cycle of order 15:1.

When the circuit switches back to sample mode, as most of the node potentials have been held at their previous values, the circuit should quickly stabilise and acquire the new current control conditions. It can be seen that to a first approximation the sampling precision will accumulate over successive sampling pulses to compensate for a short acquisition time.

A variant of the previous circuit can be used to provide a current measurement functionality using the same sampling approach to facilitate a realisable charge pumped solution. Such a solution may have no current limit function or a current limit implemented in an alternative manner.

A further variant can perform both functions by multiplexing successive sampling pulses between the current measure and current limiting functions. This doubles the time between successive feedback sample states on each function.

Figure 3:
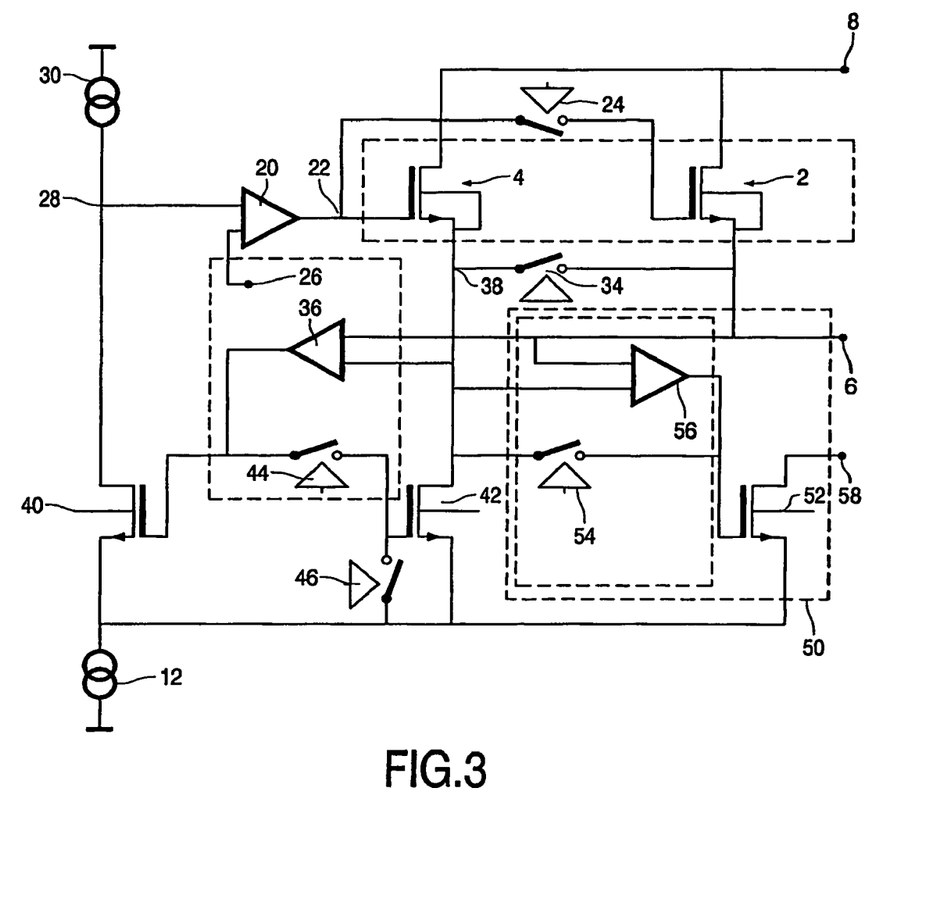
FIG. 3 shows a circuit diagram of a third embodiment of the invention.

A simple schematic diagram of a third embodiment of the invention implementing such a dual function system is shown in FIG. 3.

A measurement sample and hold circuit 50 includes a measurement FET 52 connected between a current measure output 58 and the current sink 12. The gate of the measurement FET 52 is connected to the gate of the current sink FET 42 through fifth switch 54. A third sample and hold differential amplifier 56 has its output connected to the gate of the measurement FET 52 and inputs connected to the source output 6 and the mirror summing node 38, like the second amplifier 36.

The operation of this circuit is best understood as an extension of the previous circuit. In the circuit of the third embodiment there is an extra measurement sample state squeezed in whilst the current limit functional part of the circuit is in its hold state. With the first amplifier 20 and the second amplifier 36 in their hold states, the first switch 24 closed and the third switch 42 open, the second and fourth switches 34, 46 can be opened and the fifth switch 54 closed. This will configure the third amplifier 56 to be controlling another virtual earth type circuit, using the same current sink FET 42 to source the current onto the same summing junction 38. With this circuit the measurement FET 52 acts as a separate scaled mirror device which passes a current with a magnitude that is proportional to the measured current.

At the end of its respective sampling pulse the measurement sample and hold circuit 50 is put into its hold mode and the second 34, fourth 46 and fifth 54 switches returned to their previous state in the middle of the hold cycle in the current limit function. This will maintain the measured current in the measurement FET until its next sample pulse when it will take on any new value of measured load current.

Obviously this results in the full measure current being sourced by the negative rail charge pump for two sample pulses (the feedback sample pulse and the measurement sample pulse) per complete system cycle which will involve an increase in charge pump capacity requirements. Additionally, in both the second and third embodiments the reference current, Iref, flows continuously. This current has to be sourced from the negative rail current sink charge pump circuit 12, and in the third embodiment also the measurement current also needs to be sunk by the current sink circuit 12.

Figure 4:
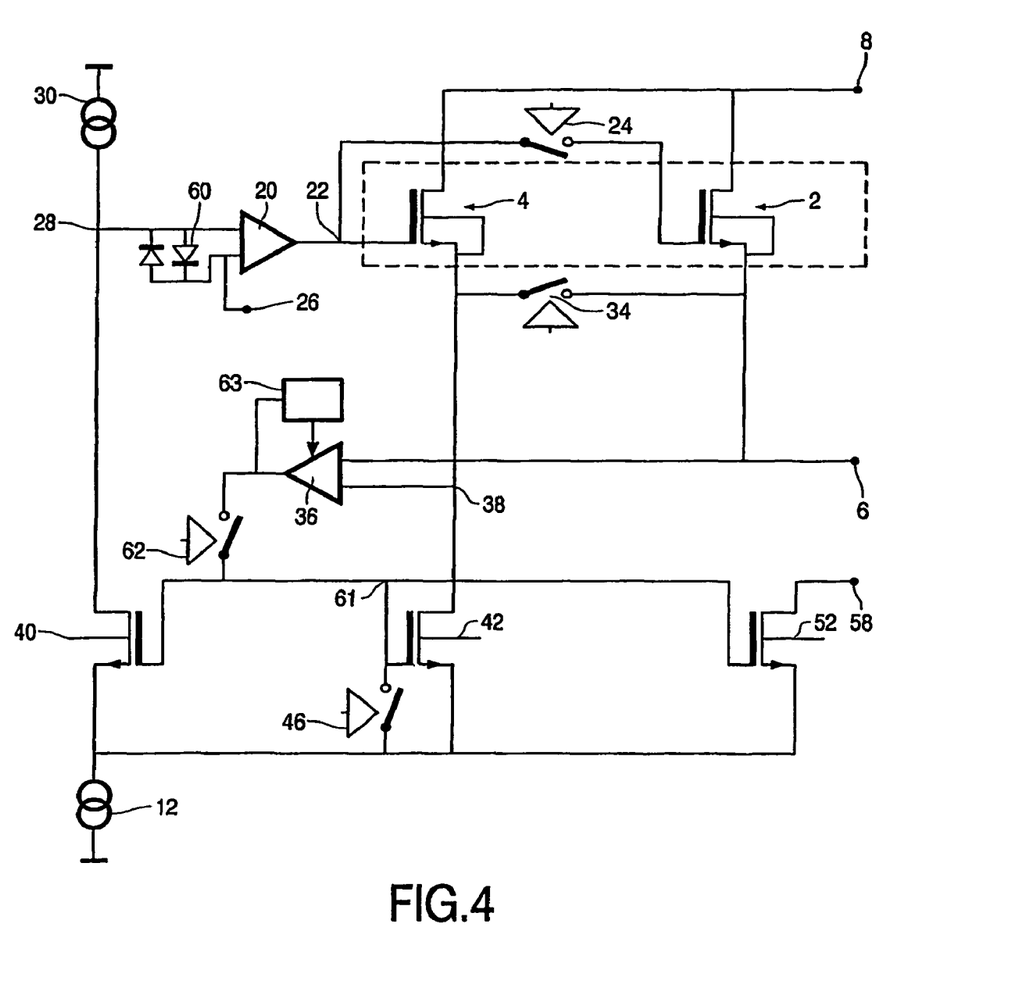
FIG. 4 shows a circuit diagram of a fourth embodiment of the invention.

A fourth embodiment is illustrated In FIG. 4, which has a similar functionality to that illustrated in FIG. 3, but addresses some of these issues.

In this design the gate of the measurement FET 52 is directly connected to a common node 61 which, is also directly connected to the gates of the mirror FET 40 and the current sink FET 42. Thus, the fifth switch 54 and third amplifier 56 are omitted. Sixth switch 62 (corresponding to the third switch in previously described embodiments) is provided between the output of second amplifier 36 and the common node 61. Back to back diodes 60 are provided on the differential inputs of the first amplifier 20.

Reference current Iref from current source 30 is pulsed such that it only flows during the feedback sample state. The mirror FET 40 only conducts during the feedback sample state and large excursions of the +ve input of the first amplifier 20 are constrained by back to back clamp diodes 60. The mirror FET 40 and measurement FET 52 now continuously mirror the current in the current sink FET 42. The current measurement output 58 now has three states, one representing the set current limit, another representing the true measured current and third being "off". The pulse of interest, the current measure signal, has to be captured by a separate sample/hold function.

The inclusion of sixth switch 62 allows the currents in the mirror trio of the current sink FET 42, the mirror FET 40 and the measurement FET 52 to be modulated to zero during the hold state, whilst retaining the previous operating state in the hold memory of the second amplifier 36. In this new configuration a single virtual earth circuit, configured around the second amplifier 36, provides the measure and current limit virtual earth functions on successive sample pulses. The first amplifier 20 and the first and second switches 24,34 function identically to the arrangement in FIG. 3.

The arrangement of FIG. 4 is particularly interesting because, with only a little additional circuitry the long "hold" states, of 7 or 15 sample pulse duration, can easily be used to enable the second amplifier 36 to auto-zero itself using its own loop gain and autozero circuit 63. Such techniques are well known to designers skilled in these techniques. After completion of amplifier auto-zeroing there should still be time for the amplifier to re-acquire its "hold" state prior to the next sample pulse.

This simple extension solves a lot of the problems of attaining sufficient accuracy from a virtual earth circuit with the very low values of on-state voltage drop that are often found in cool running applications. This error arises because the input offset of an amplifier that is used to implement the virtual earth function becomes significant compared to the on-state voltage drop (particularly at low current levels). With balanced, charge injection cancelling techniques being used for the auto-zeroing the effective input offsets can be reduced from the mV level to levels an order of magnitude or two lower.

Figure 5:
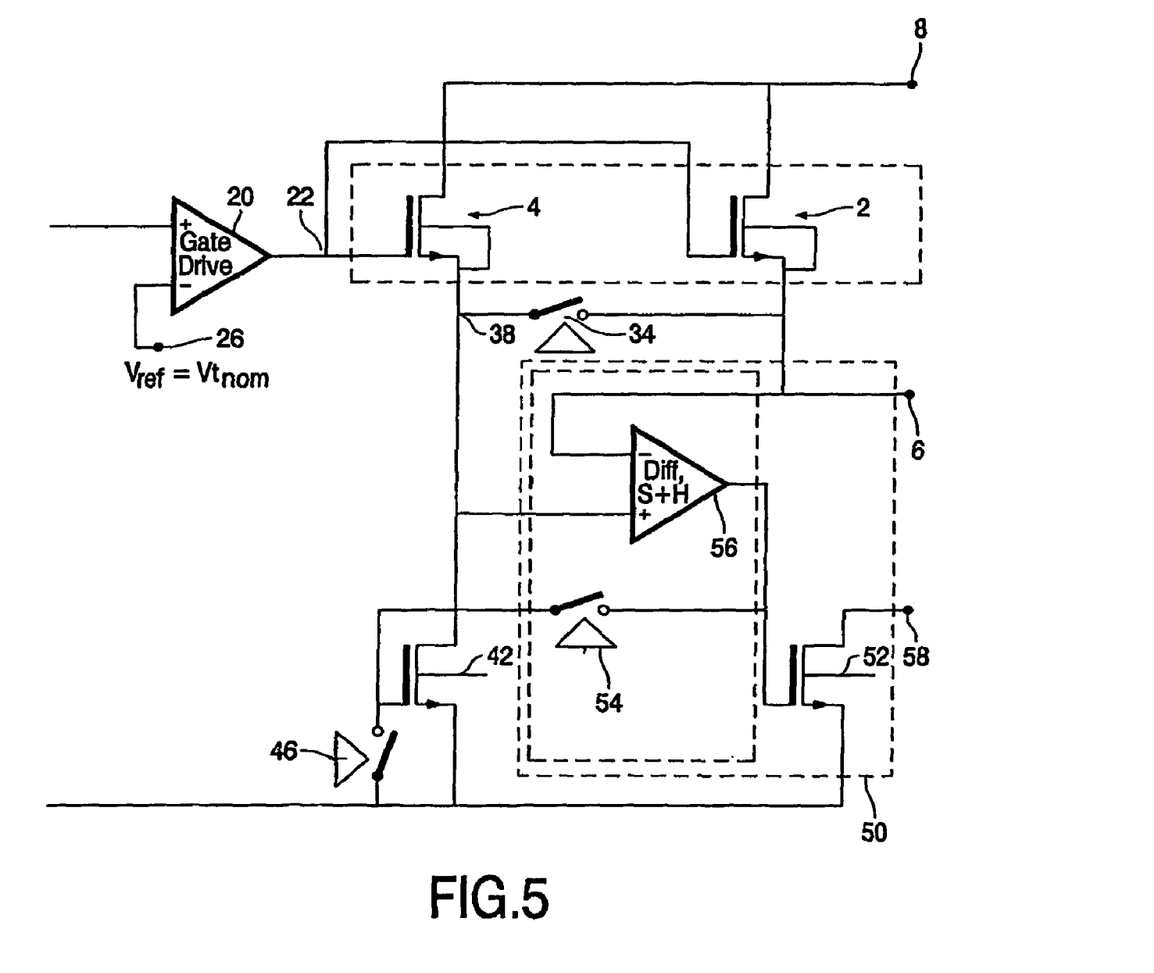
FIG. 5 shows a circuit diagram of a fifth embodiment of the invention.
Figure 6:
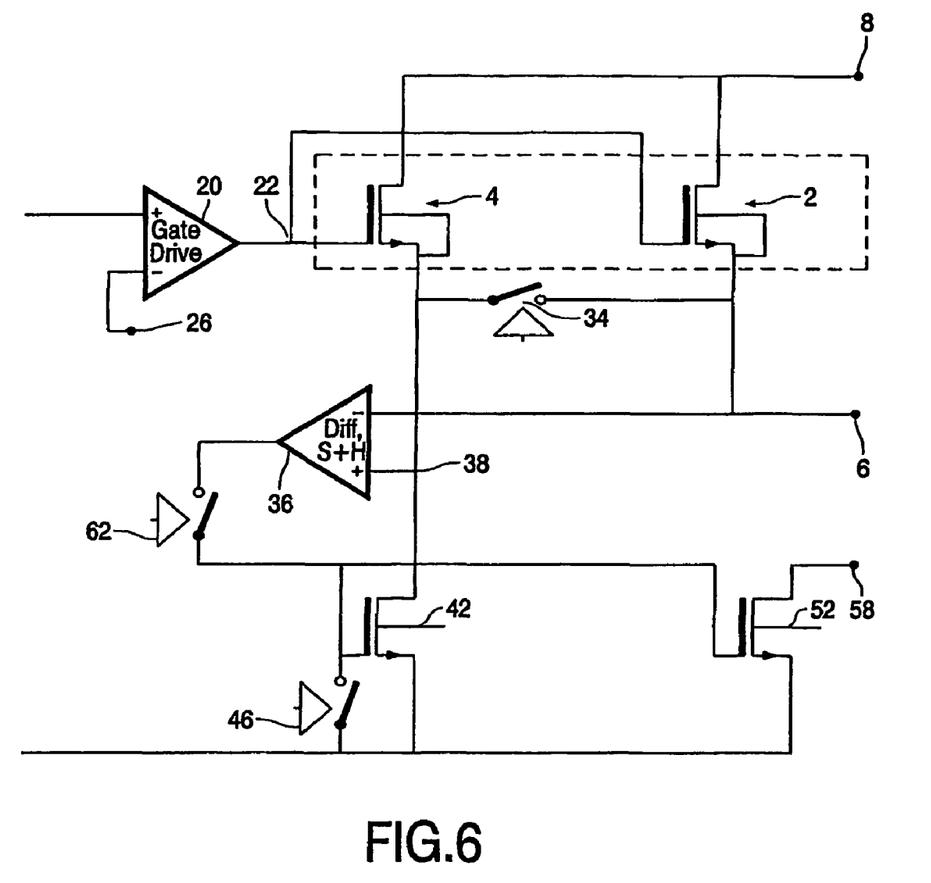
FIG. 6 shows a circuit diagram of a sixth embodiment of the invention.

Two further embodiments are disclosed in FIGS. 5 and 6. The embodiments of FIGS. 1 to 4 relate to a current limited power device, which is one approach to limiting the peak dissipation in a semiconductor power device in fault conditions. FIGS. 5 and 6, on the other hand relate to a power device with a current measurement circuit. Such power devices can be used in a current trip approach where an accurate current measurement is made and the device latched off if the current ever exceeds a predetermined maximum, which may be preset or user-determined. In this case dissipation is contained, not by using a feedback control loop, but by selecting a value for the maximum current allowed before it trips such that the device on resistance contains the allowable voltage.

FIGS. 5 and 6 accordingly show circuits in protected power devices for use in current trip circuits. They correspond to the circuits in FIGS. 3 and 4 except for the omission of the feedback loop driving the first differential sample and hold amplifier 20. The first and third switches 24, 44 are accordingly omitted, the former replaced by a permanent connection between the differential amplifier 20 and the main cell 2 gate. The remaining second, fourth, fifth and sixth switches will be described using these terms for consistency with the above description even in the absence of the first and third switches in these embodiments.

The circuits operate as in the circuits of FIGS. 3 and 4 except that the feedback sample state is omitted. There remains a measurement sample state in which state a measurement current is mirrored onto the measurement output terminal 58 and a hold state.

In the circuit of FIG. 5, the fourth switch 46 is opened and the fifth switch 54 closed, to set up a measurement sample state having a virtual earth circuit with node 38 as the virtual earth and the voltage on the output of sample and hold amplifier 56 driving the current sink FET 42 to sink the current from the sense cells. This drives the voltage on the gate of measurement FET 52 to sink the same current through terminal 58. In the hold state, fifth switch 54 is opened and second and fourth switches closed to continue to sink the measurement current through measurement FET 52.

Likewise, in the circuit of FIG. 6, in the measurement sample state second switch 34 and fourth switch 46 are opened and sixth switch 62 closed. The second differential amplifier 36 operates with node 38 as virtual earth to obtain conditions in which measurement FET 52 sinks a current through terminal 58 that matches the sense cell current. This current only passes in the measurement sample state. In the normal, hold state, second switch 34 and fourth switch 46 are closed and sixth switch 62 opened. As in the arrangement of FIG. 4, the second differential amplifier 36 can auto-zero in the hold state.

Although the circuits of FIGS. 5 and 6 are particularly designed for current trip operation, it will be appreciated that circuits according to FIGS. 1 to 4 are also able to operate in this mode, especially the circuits of FIGS. 3 and 4 with integrated measurement circuitry.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A device, comprising:
a power insulated gate field effect transistor, having a main cell controlled by a main cell insulated gate and a sense cell controlled by a sense cell insulated gate;
a sample and hold circuit connected in series with the sense cell and arranged to operate in a plurality of states including at least one sample state and a hold state, and configured to sense a current flowing through the sense cell when in the at least one sample state but not in the hold state;
a reference current source coupled to provide a reference current to the sample and hold circuit;
a current mirror circuit arranged to operate in the sample state and as feedback to tend to drive, with the reference current, the sense cell gate towards a voltage in which a target current matching the reference current passes through the sense cell.

2. A device according to claim 1 wherein the sample and hold circuit is a feedback sample and hold circuit configured to provide an output voltage to drive the sense cell gate towards a voltage in which the target current passes through the sense cell, and to operate in the hold state to hold its output voltage to drive the main cell insulated gate with that output voltage.

3. A device according to claim 2 wherein the output of the feedback sample and hold circuit is connected to a gate drive node connected to the sense cell insulated gate and connected to the main cell insulated gate through a first switch, the first switch being held open in the sample state to isolate the main cell insulated gate from the gate drive node and closed in the hold state to drive the main cell insulated gate from the gate drive nodes.

4. A device according to claim 1 further comprising control circuitry connected to control switch or switches for cycling between the sample and the hold modes with a duty cycle in which the ratio of time in the sample mode to time in the hold mode is in the range 1:5 to 1:50.

5. A device according to claim 1, wherein the current mirror circuit is configured to
in the sample state, provide the feedback to modify the voltage level applied to the sense cell insulated gate based upon a comparison of the current sensed in the sense cell to a reference current, to drive the sense cell gate at a target voltage level at which the current in the sense cell matches the reference current, and
in the hold state, drive the main cell gate at the target voltage.

6. A method of operating a power field effect transistor, the method comprising:
providing the power field effect transistor having a main cell controlled by a main cell insulated gate, a sense cell controlled by a sense cell insulated gate, and a sample and hold circuit connected to the sense cell;
switching to at least one sample state in which the sample and hold circuit outputs a voltage to drive the sense cell but not the main cell, and sensing the sense cell current;
switching to a hold state in which the sense cell current is not measured; and
cycling between the sample and hold states.

7. A method of operating a power field effect transistor according to claim 6 wherein
the sample and hold circuit is a feedback sample and hold circuit connected to the sense cell;
in a feedback sample state, the feedback sample and hold circuit outputs a voltage to drive the sense cells but not the main cell, the feedback sample and hold circuit output voltage being driven towards a target voltage in which a predetermined target current passes through the sense cell, based upon the sensed current; and in the hold state the output voltage of the feedback sample and hold circuit is held constant and used to drive the main cell insulated gates with the target voltage.

8. A method of operating a power field effect transistor according to claim 6, wherein in a measurement sample state, the sample and hold circuit outputs a current on a measurement output terminal corresponding to the current through the sense cell.

9. A method according to claim 6 wherein the ratio of the time in the at least one sample state to time in the hold state is in the range 1:5 to 1:20.

10. A method according to claim 6, further including, in the at least one sample state,
  comparing the sensed current with a reference current, and
  based upon the comparison, modifying the output voltage to drive the sense cell to a target voltage at which the sense cell passes a current that matches the reference current, in the hold state, applying the target voltage to the main cell insulated gate.

11. An electronic device, comprising:

a power insulated gate field effect transistor having a main cell controlled by a main-cell insulated gate and a sense cell controlled by a sense-cell insulated gate;

a current mirror circuit configured to, in a sample state, provide feedback corresponding to current flowing through the sense cell;

a sample and hold circuit configured to in the sample state, output a voltage to drive the sense cell gate towards a target voltage at which current flowing through the sense cell matches a reference current, based upon the feedback from the current mirror circuit, and in a hold state, output the target voltage to drive the main cell insulated gate; and a switch circuit connected between the sample and hold circuit and the respective gates of the main and sense cells, the switch circuit being configured to
  in the sample state, isolate the main cell insulated gate from the sample and hold circuit, and
  in the hold state, connect the sample and hold circuit to the main cell insulated gate.

12. A device according to claim 11, wherein the switch circuit is configured to cycle between the sample and the hold states at a duty cycle in which the ratio of time in the sample state to time in the hold state is in the range of 1:5 to 1:20.

13. A device according to claim 11, wherein the switch circuit is configured to cycle between the sample and the hold states at a duty cycle in which the ratio of time in the sample state to time in the hold state is in the range of 1:5 to 1:50.

14. A device according to claim 11, further including
a reference current source configured to provide the reference current, and
a summing node having an input connected to the reference current source and the current mirror circuit for respectively receiving the reference current and the feedback, the summing node being configured to provide a summed output corresponding to the reference current and the feedback for driving the sense cell gate towards the target voltage.

* * * * *